US011716077B2

(12) United States Patent
Chu

(10) Patent No.: US 11,716,077 B2
(45) Date of Patent: Aug. 1, 2023

(54) SWITCH CONTROL CIRCUIT, UNIVERSAL SERIAL BUS CONTROL CIRCUIT, AND METHOD FOR CONTROLLING A POWER SWITCH THEREOF

(71) Applicant: REALTEK SEMICONDUCTOR CORPORATION, Hsinchu (TW)

(72) Inventor: Li Cheng Chu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/689,585

(22) Filed: Mar. 8, 2022

(65) Prior Publication Data

US 2023/0090107 A1 Mar. 23, 2023

(30) Foreign Application Priority Data

Sep. 22, 2021 (TW) ................................. 110135137

(51) Int. Cl.
*H02H 1/00* (2006.01)
*H03K 17/082* (2006.01)
*H03K 5/24* (2006.01)

(52) U.S. Cl.
CPC ......... *H03K 17/082* (2013.01); *H02H 1/0007* (2013.01); *H03K 5/24* (2013.01)

(58) Field of Classification Search
None
See application file for complete search history.

(56) References Cited

U.S. PATENT DOCUMENTS

| | | | | |
|---|---|---|---|---|
| 7,532,445 | B2* | 5/2009 | Rana | H02H 9/041 |
| | | | | 327/539 |
| 9,843,319 | B2* | 12/2017 | Petruzzi | H03K 17/082 |
| 10,110,216 | B1* | 10/2018 | Knoedgen | H03K 17/0822 |
| 2017/0294907 | A1* | 10/2017 | Volke | H02M 1/088 |
| 2021/0152169 | A1* | 5/2021 | Wong | H03K 17/0822 |
| 2021/0328389 | A1* | 10/2021 | Bodnaruk | H02H 3/20 |

* cited by examiner

*Primary Examiner* — Stephen W Jackson
(74) *Attorney, Agent, or Firm* — WPAT, P.C., Intellectual Property Attorneys; Anthony King

(57) ABSTRACT

A switch control circuit includes a power switch, a first protection unit, and a second protection unit. The power switch has a first terminal coupled to a first voltage terminal for receiving a first voltage, a second terminal coupled to a second voltage terminal for receiving a second voltage, and a control terminal receives a control voltage. In a first mode, the control voltage is greater than the first voltage. In a second mode, when a voltage of the second voltage terminal is smaller than a first reference voltage, the first protection unit pulls down the control voltage to reduce a current flowing through the power switch. When the voltage of the second voltage terminal is smaller than the second reference voltage, the second protection unit pulls down the control voltage to a ground voltage.

20 Claims, 4 Drawing Sheets

SWITCH CONTROL CIRCUIT, UNIVERSAL SERIAL BUS CONTROL CIRCUIT, AND METHOD FOR CONTROLLING A POWER SWITCH THEREOF

CROSS-REFERENCE TO RELATED APPLICATIONS

This application claims priority of Taiwan application No. 110135137, filed on Sep. 22, 2021, which is incorporated by reference in its entirety.

TECHNICAL FIELD

The present application relates to a switch control circuit, particularly to a switch control circuit having a short-circuit protection mechanism.

BACKGROUND

Power switches are often used to control the current transmission path between two terminals. In order to withstand a higher current, the power switch is generally implemented using a transistor with better current endurability and smaller turned-on resistance. In addition, depending on the application, the voltage received at both terminals of the power switch may change during the operations, and the power switch may be turned on or off in response to system requirements when the voltage changes. For example, when the voltage difference between the two terminals of the power switch gets larger, the system will turn off the power switch as a short-circuit protection mechanism in order to avoid generating excessive current and causing damage to the components in the circuit.

However, the metal traces used to transmit voltage may have inductive characteristics, and therefore, when the voltage changes, if the control voltage is immediately switched from high to low for turning off the transistor in the power switch, the equivalent inductance of the metal trace will continue to output current to the transistor's drain, and a large amount of charge will be accumulated at the transistor's drain instantaneously. In such case, the accumulated charge in the transistor's drain will cause the drain voltage to increase drastically, and when the transistor's drain-gate voltage exceeds the withstand voltage of the transistor, the transistor will be damaged and the power switch will not operate properly. Therefore, how to effectively and safely provide a short-circuit protection mechanism is an issue to be solved in the related field.

Summary of the Invention

DETAILED DESCRIPTION

Figure 1:
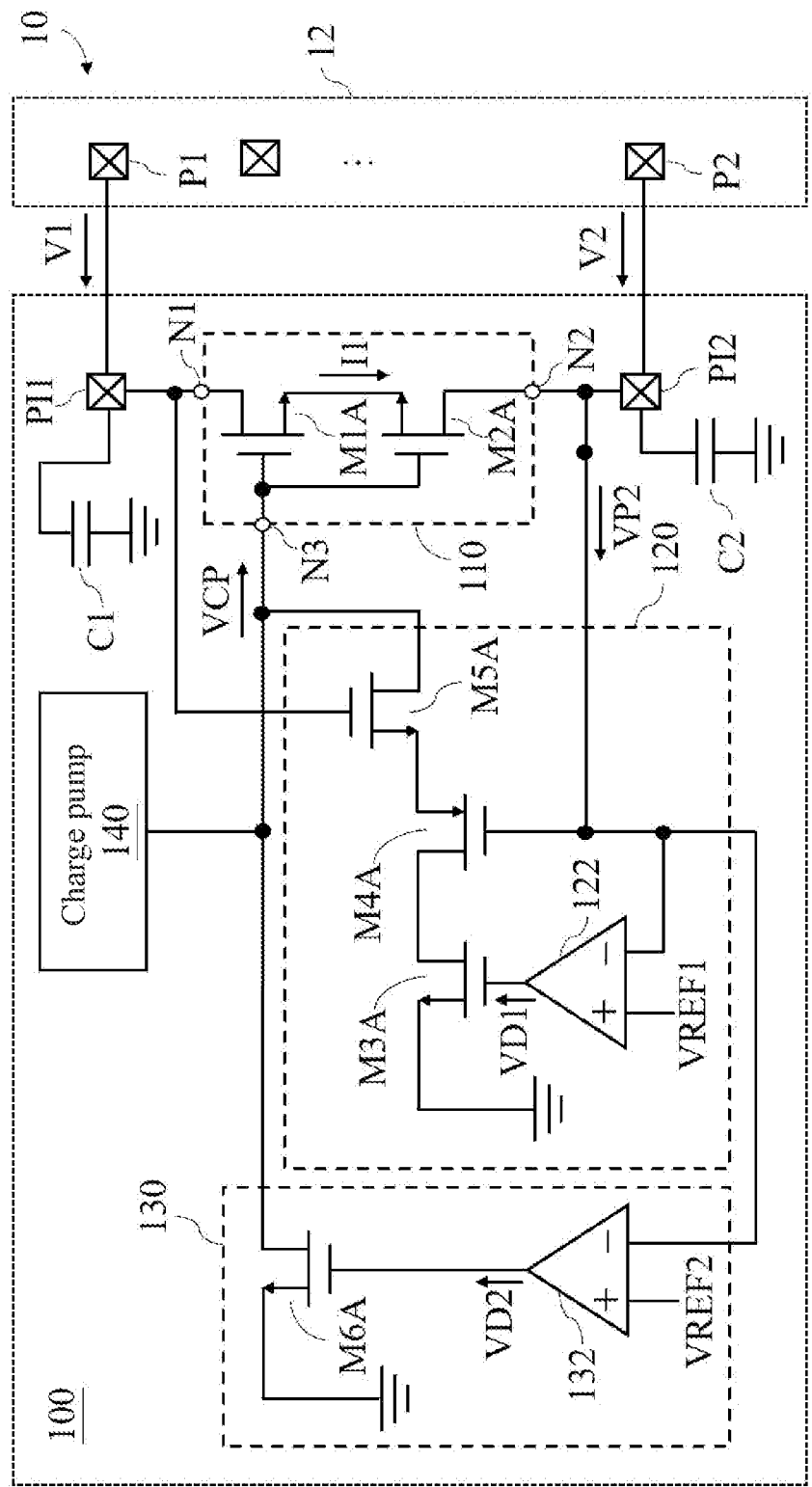
FIG. 1 is a schematic diagram illustrating a universal serial bus control circuit according to one embodiment of the present disclosure.

FIG. 1 is a schematic diagram illustrating a universal serial bus control circuit 10 according to one embodiment of the present disclosure. The universal serial bus control circuit 10 can include a universal serial bus (USB) interface 12 and a switch control circuit 100. The USB interface 12 can include a plurality of pins required by the USB, and the switch control circuit 100 can be configured to control the current between a first pin P1 and a second pin P2 thereof.

As shown in FIG. 1, the switch control circuit 100 can include a first voltage terminal PI1, a second voltage terminal PI2 and a power switch 110. The first voltage terminal PI1 can be coupled to the first pin P1 of the USB interface 12 to receive a first voltage V1, and the second voltage terminal PI1 can be coupled to the second pin P2 of the USB interface 12 to receive a second voltage V2. Furthermore, the power switch 110 has a first terminal N1, a second terminal N2 and a control terminal N3, wherein the first terminal N1 of the power switch 110 can be coupled to the first voltage terminal PI1, the second terminal N2 of the power switch 110 can be coupled to the second voltage terminal PI2, and the control terminal N3 of the power switch 110 can receive a control voltage VCP. In the present embodiment, the power switch 110 can include a first transistor M1A and a second transistor M2A. The first transistor M1A has a first terminal, a second terminal and a control terminal, wherein the first terminal of the first transistor M1A can be coupled to the first terminal N1 of the power switch 110, and the control terminal of the first transistor M1A can be coupled to the control terminal N3 of the power switch 110. The second transistor M2A has a first terminal, a second terminal and a control terminal, wherein the first terminal of the second transistor M2A can be coupled to the second terminal of the first transistor M1A, the second terminal of the second transistor M2A can be coupled to the second terminal N2 of the power switch 110, and the control terminal of the second transistor M2A can be coupled to the control terminal N3 of the power switch 110. That is, the switch control circuit 100 can control the extent that the first transistor M1A and the second transistor M2A are conducted by adjusting the level of the control voltage VCP, thereby turning on or off the power switch 110.

In the present embodiment, the USB interface 12 can be, for example, a type-C USB interface, wherein the first pin P1 can be such as a VCONN pin, and the second pin P2 is a configuration channel (CC) pin. In such case, the second pin P2 may operate under different voltages depending on different application modes so that the system may identify the current application mode in use. That is, in different modes, the second voltage V2 may have different voltage values, and the switch control circuit 100 can control the power switch 110 to correspondingly turn on or off the current path between the first voltage terminal PI1 and the second voltage terminal PI2.

For example, in the first mode, the first voltage V1 can be, for example about 5V, and the second voltage V2 can be slightly smaller than the first voltage V1, e.g., about 4.9V; in such case, the power switch 110 can be turned on, and the current I1 can flow from the first voltage terminal PI1 to the second voltage terminal PI2. However, in the second mode, the second voltage V2 will be pulled down to the ground voltage; that is, the second voltage V2 in the first mode is greater than the second voltage V2 in the second mode, and hence, when entering the second mode from the first mode, a voltage difference between the first voltage terminal PI1 and the second voltage terminal PI2 will be increased correspondingly; at the same time, in order to prevent the current I1 from getting too high and thereby damaging transistors M1A and M2A the power switch 110, the switch control circuit 100 can turn off the power switch 110.

In the present embodiment, the switch control circuit 100 can further include a first capacitor C1 and a second capacitor C2. The first capacitor C1 can have a first terminal and a second terminal, the first terminal of the first capacitor C1 can be coupled to the first voltage terminal PI1, and the second terminal of the first capacitor C1 can be coupled to the ground voltage. The second capacitor C2 can have a first terminal and a second terminal, the first terminal of the second capacitor C2 can be coupled to the second voltage terminal PI2, and the second terminal of the second capacitor C2 is coupled to the ground voltage. The first capacitor C1 and the second capacitor C2 can reduce the extent that the voltages of the first voltage terminal PI1 and the second voltage terminal PI2 change drastically in response to the change of the first voltage V1 and the second voltage V2, thereby making the voltages of the first voltage terminal PI1 and the second voltage terminal PI2 more stable.

Furthermore, in the present embodiment, the first voltage terminal PI1 and the second voltage terminal PI2 can be respectively coupled to the first pin P1 and the second pin P2 of the USB interface 12 through wirings external to the switch control circuit 100 for receiving the first voltage V1 and the second voltage V2. For example, the switch control circuit 100 and the USB interface 12 may be connected through bonding wires inside the chip package. Since bonding wires or other external traces are often inductive, the current originally flowing from the first pin P1 to the first voltage terminal PI1 does not disappear instantaneously when the power switch 110 is turned off, but continues to accumulate charges at the first voltage terminal PI1, thereby increasing the voltage at the first voltage terminal PI1. In such case, if the control voltage VCP received by the control terminal of transistor M1A is pulled down directly to the ground voltage, the drain-gate voltage of transistor M1A may be too high and cause damage to transistor M1A. Furthermore, in the application of type-C USB, in order to improve the charging efficiency, a higher intensity current (such as 1.5 amps or 3 amps) may flow through the first pin P1, in such case, it may cause more serious damage to the transistor M1A.

Similarly, at the moment when the power switch 110 is turned off, the current flowing into the second pin P2 from the second voltage terminal PI2 will not disappear instantaneously, but will continue to draw charges from the second voltage terminal PI2, thereby causing the voltage of the second voltage terminal PI2 continues to drop. In such case, if the voltage of the second voltage terminal PI2 drops to a negative voltage, it may have a great impact on the stability of the system, and even break down the system.

In order to avoid circuit damage due to the instantaneous turn-off of the power switch 110 in the second mode that results in the voltage at the first voltage terminal PI1 being too high or the voltage at the second voltage terminal PI1 being too low, the switch control circuit 100 can use a protection unit 120 and a third protection unit 130 to gradually turn off the power switch 110 in a stepwise manner.

Figure 2:
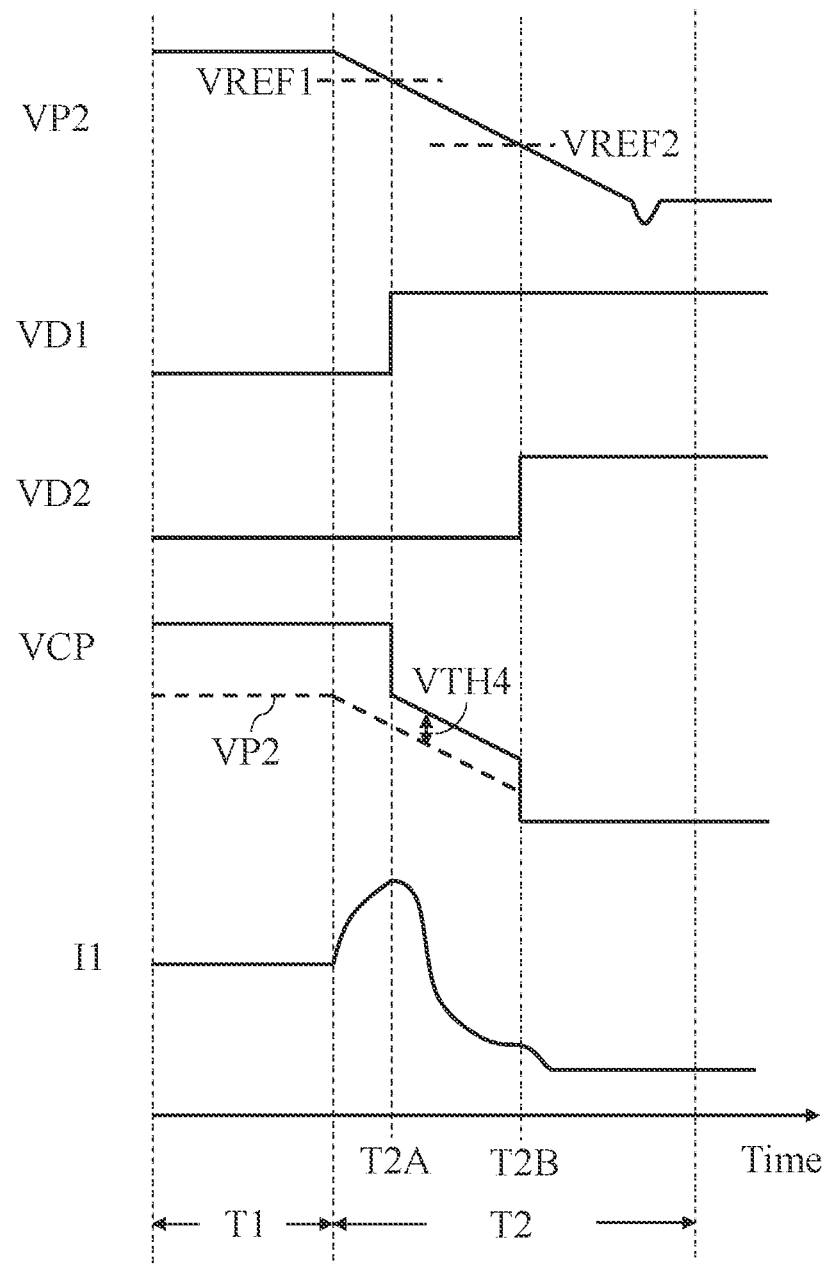
FIG. 2 is a timing diagram showing the voltage current change inside the switch control circuit of FIG. 1.

FIG. 2 is a timing diagram showing the voltage current change inside the switch control circuit 100 of FIG. 1. During the first time period T1 shown in FIG. 2, the switch control circuit 100 operates in the first mode. In such case, the control voltage VCP is much greater than the first voltage V1; for example, the first voltage V1 can be 5V, and the control voltage VCP can be 10V; hence, the transistors M1A and M2A in the power switch 110 are fully turned on. In the present embodiment, in order to generate the control voltage VCP that is higher than the first voltage V1, the switch control circuit 100 can further include a charge pump 140 to generate the control voltage VCP.

During the time period T2 shown in FIG. 2, the switch control circuit 100 operates in the second mode. In such case, the second voltage V2 is pulled down to the ground voltage, and the voltage VP2 of the second voltage terminal PI2 also drops gradually while the current I1 flowing through the power switch 110 rises gradually. In the present embodiment, the first protection unit 130 can be coupled to the control terminal N3 of the power switch 110 and the second voltage terminal PI2, and can continuously compare the voltage VP2 of the second voltage terminal PI2 and a first reference voltage VREF1, and at the time point T2A, when the voltage VP2 of the second voltage terminal PI2 is smaller than the first reference voltage VREF1, the first protection unit 130 will pull down the control voltage VCP to reduce the transistors M1A and M2A in the current I1 turned on by the power switch 110.

Furthermore, as shown in FIG. 1, the second protection unit 130 can be coupled to the control terminal N3 of the power switch 110 and the second voltage terminal PI2, and can continuously compare the voltage of the second voltage terminal PI2 and a second reference voltage VREF2. In the present embodiment, the first reference voltage VREF1 is greater than the second reference voltage VREF2, and hence, during the process that the voltage VP2 of the second voltage terminal PI2 is gradually pulled down, a first protection unit 120 is first triggered to pull-down the control voltage VCP, and at the time point T2B after the time point T2A, when the voltage VP2 of the second voltage terminal PI2 is smaller than the second reference voltage VREF2, the second protection unit 130 will turn on a discharge path to pull down the control voltage VCP to the ground voltage, thereby turning off the transistors M1A and M2A in the power switch 110.

That is, during the time period between the time point T2A and T2B, when the first protection unit 120 is triggered to lower the control voltage VCP, and the second protection unit 130 is not triggered, the power switch 110 will not be turned off directly. In such case, during the time period between the time point T2A and T2B, the current flowing from the first pin P1 to the first voltage terminal PI1 can still flow to the second voltage terminal PI2 and the second pin P2 through the power switch 110, so that the aforementioned issues of excessively high voltage at the first voltage terminal PI1 and excessively voltage at the second voltage terminal PI2 can be avoided. Furthermore, since the first protection unit 130 can pull down the control voltage VCP to a lower voltage value, the on-resistance of transistors M1A and M2A will increase accordingly, thereby avoiding the excessive current I1 so as to achieve the effect of short-circuit protection. In addition, in FIG. 2, since the external trace coupled to the second voltage terminal PI2 has an inductance characteristic, an undershoot may occur before the second voltage V2 is pulled down and stabilized to the ground voltage.

As shown in FIG. 1, the first protection unit 120 can include a first comparator 122, a third transistor M3A, a fourth transistor M4A and a fifth transistor M5A. The first comparator 122 has a first input terminal, a second input terminal and an output terminal, the first input terminal of the first comparator 122 can be coupled to the first reference voltage VREF1, and the second input terminal of the first comparator 122 can be coupled to the second voltage terminal PI2. The third transistor M3A has a first terminal, a second terminal and a control terminal, the first terminal of the third transistor M3A can be coupled to the ground voltage, and the control terminal of the third transistor M3A can be coupled to the output terminal of the first comparator 122. The fourth transistor M4A has a first terminal, a second terminal and a control terminal, the first terminal of the fourth transistor M4A can be coupled to the second terminal of the third transistor M3B, and the control terminal of the fourth transistor M4A can be coupled to the second voltage terminal PI2. The fifth transistor M5A has a first terminal, a second terminal and a control terminal, the first terminal of the fifth transistor M5A can be coupled to the second terminal of the fourth transistor M4A, the second terminal of the fifth transistor M5A can be coupled to the control terminal of the power switch 110, and the control terminal of the fifth transistor M5A can be coupled to the first terminal N1 of the power switch 110.

In the present embodiment, the first transistor M1A, the second transistor M2A, the third transistor M3A and the fifth transistor M5A can be N-type transistors, and the fourth transistor M4A can be a P-type transistor. In such case, as shown in FIG. 2, when the voltage VP2 of the second voltage terminal PI2 is smaller than the first reference voltage VREF1, the voltage VD1 of the output terminal of the first comparator 122 would change from a low voltage to a high voltage, so that the third transistor M3A can be turned on, and the fifth transistor M5A and the fourth transistor M4A can also be turned on, thereby pulling down the control voltage VCP generated by the charge pump 140 to increase the on-resistance of the transistors M1A and M2A and lower the intensity of the current I1. However, if the control voltage VCP is pulled down to be lower than the sum of the voltage VP2 of the second voltage terminal PI2 and the threshold voltage VTH4 of the fourth transistor M4A, the fourth transistor M4A would be turned off, and hence the first protection circuit 120 can keep the control voltage VCP at a voltage value that is greater than the voltage VP2 of the second voltage terminal PI2 by a threshold voltage VTH4, as shown in FIG. 2. In such case, if the absolute value of the threshold voltage VTH4 of the fourth transistor M4A is greater than the absolute value of the threshold voltage of the transistors M1A and M2A in the power switch 110, the transistors M1A and M2A can be maintained in the on-state, so that the power switch 110 is not turned off too quickly and cause the issue of excessively high voltage at the first voltage terminal PI1 and excessively low voltage at the second voltage terminal PI2.

In the present embodiment, since the transistors M1A and M2A in the power switch 110 need to transmit a larger current, transistors with a larger channel width are generally required. In contrast, since the required driving ability of the charge pump 140 is rather low, the third transistor M3A, the fourth transistor M4A and the fifth transistor M5A can use transistors with a smaller channel width. That is, the channel widths of the transistors M1A and M2A can be greater than the channel widths of the third transistor M3A, the fourth transistor M4A and the fifth transistor M5A. Generally, in such case, the absolute value of the threshold voltage of the transistors M1A and M2A is also smaller than the absolute value of the threshold voltage of the third transistor M3A, the fourth transistor M4A and the fifth transistor M5A, thereby satisfying the above-mentioned requirements.

Furthermore, as shown in FIG. 1, the second protection unit 130 can include a second comparator 132 and a sixth transistor M6A. The second comparator 120 has a first input terminal, a second input terminal and an output terminal, the first input terminal of the second comparator 120 can be coupled to the second reference voltage VREF2, and the second input terminal of the second comparator 120 can be coupled to the second voltage terminal PI2. The sixth transistor M6A has a first terminal, a second terminal and a control terminal, the first terminal of the sixth transistor M6A can be coupled to the ground voltage, the second terminal of the sixth transistor M6A can be coupled to the control terminal N3 of the power switch 110, and the control terminal of the sixth transistor M6A can be coupled to output terminal the of the second comparator 132.

In such case, as shown in FIG. 2, when the voltage VP2 of the second voltage terminal PI2 drops continuously and becomes is smaller than the second reference voltage VREF2 at the time point T2B, the voltage VD2 of the output terminal of the second comparator 132 changes from low voltage to high voltage, thereby turning on the sixth transistor M6A, which in turn pulls down the control voltage VCP to the ground voltage.

Since the switch control circuit 100 can use the first protection unit 120 and the second protection unit 130 to turn off the power switch 110 in a stepwise manner, it can avoid the issue of the first voltage terminal PI1 being excessively high and the second voltage terminal PI2 being excessively low when the power switch 110 is turned off too quickly while it can still achieve the effect of short-circuit protection.

In some embodiments, in addition to the first mode and the second mode, the switch control circuit 100 may also operate in other modes, and in some modes, the second voltage V2 may be higher than the first voltage V1. Therefore, in the embodiment of FIG. 1, the second terminal of the first transistor M1A may be the source terminal of the first transistor M1A, and the first terminal of the second transistor M2A may be the source terminal of the second transistor M2A. In other words, the source terminals of the first transistor M1A and the second transistor M2A can be connected to each other to meet the operation requirements in different modes. However, the present disclosure is not limited to this, in some embodiments, the second terminal of the first transistor M1A can be the drain terminal of the first transistor M1A, and the first terminal of the second transistor M2A can be the drain terminal of the second transistor M2A, that is, the drain terminals of the first transistor MIA and the second transistor M2A can be connected to each other.

Further, in the present embodiment, the power switch 110 can include transistors M1A and M2A, wherein the first transistor M1A can be a low-voltage transistor, and the second transistor M2A can be a high-voltage transistor. However, the present disclosure is not limited thereto, and in some other embodiments, the power switch 110 can only include one transistor.

Figure 3:
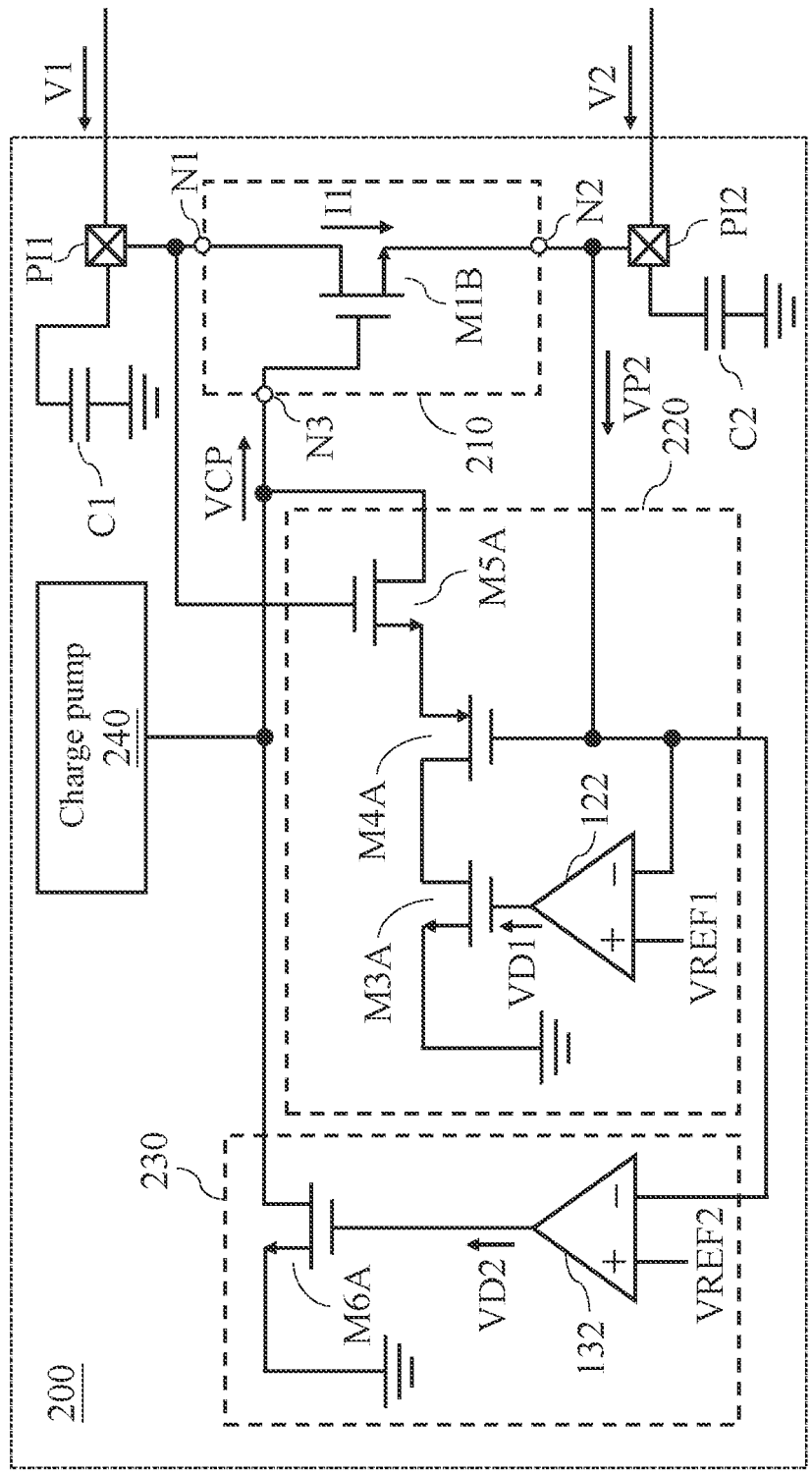
FIG. 3 is a schematic diagram illustrating a s control circuit according to another embodiment of the present disclosure.

FIG. 3 is a schematic diagram illustrating a switch control circuit 200 according to another embodiment of the present disclosure. The switch control circuit 200 and the switch control circuit 100 have similar structures and can operate following the same principles. However, a power switch 210 of the switch control circuit 200 only includes a first transistor M1B. The first transistor M1B has a first terminal, a second terminal and a control terminal, the first terminal of the first transistor M1B is coupled to the first terminal N1 of the power switch 210, the second terminal of the first transistor M1B is coupled to the second terminal N2 of the power switch 210, and the control terminal of the first transistor M1B is coupled to the control terminal N3 of the power switch 210.

In the embodiment shown in FIG. 3, the switch control circuit 200 can, during the process that the voltage VP2 of the second voltage terminal PI2 changes from the high voltage to the low voltage, pull down the control voltage VCP generated by the charge pump 240 to the ground voltage in a stepwise manner by using the first protection unit 220 and the second protection unit 230, thereby preventing the issue of the first voltage terminal PI1 being excessively high and the second voltage terminal PI2 being excessively low when the power switch 210 is turned off too quickly while it can still achieve the effect of short-circuit protection. In the present embodiment, the switch control circuits 100 and 200 can be applied in the universal serial bus control circuit 10; however, the present disclosure is not limited thereto, and in some other embodiments, the switch control circuits 100 and 200 can also be applied in other power switch circuits in need of short-circuit protection.

Figure 4:
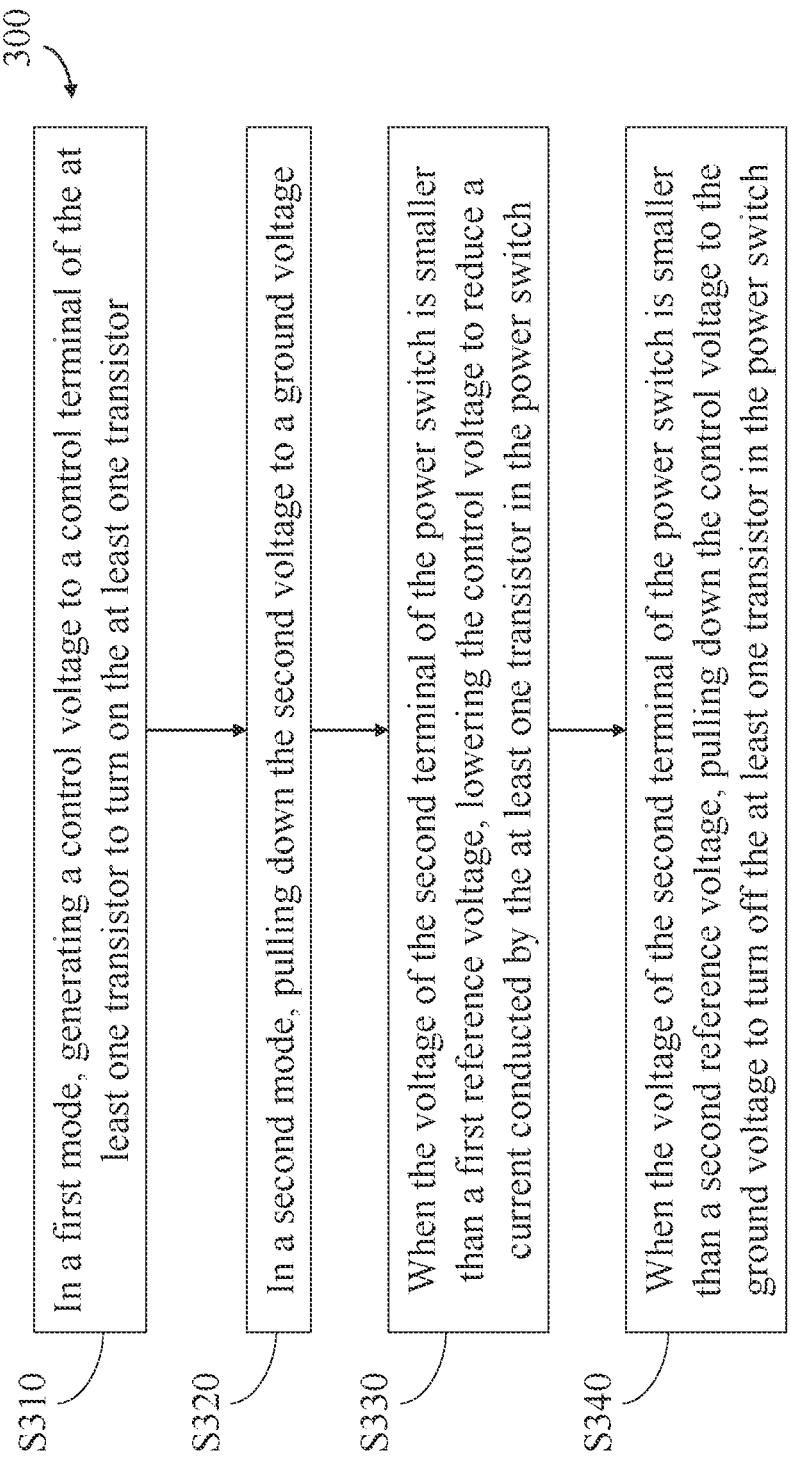
FIG. 4 is a flow chart illustrating the method for controlling a power switch according to one embodiment of the present disclosure.

FIG. 4 is a flowchart illustrating a method 300 for controlling a power switch according to one embodiment of the present disclosure; the method 300 include Steps S310 to S340. In some embodiments, the method 300 can be applied to control the power switch 110. As shown in FIG. 1, the first terminal N1 of the power switch 110 can be coupled to the first voltage terminal PI1 to receive the first voltage V1, and the second terminal N2 of the power switch 110 can be coupled to the second voltage terminal PI2 to receive the second voltage V2.

In Step S310, the power switch 110 can operate in a first mode, during which period, the power switch 110 can provide the control voltage VCP at a high voltage to turn on the transistors M1A and M2A in the power switch 110. Next, in Step S320, the second voltage V2 received by the power switch 110 starts to be pulled down, and at this time, the power switch 110 will operate in the second mode. During the process of the second voltage V2 being pulled down to the ground voltage, when the second terminal N2 of the power switch 110 is smaller than the first reference voltage VREF1, the first protection unit 120 is used to perform Step S330 to lower the control voltage VCP, so that the power switch 110 is kept turned on, but at the same time the current flowing through the power switch 110 is reduced. Then, when the voltage of the second terminal N2 of the power switch 110 is smaller than the second reference voltage VREF2, the second protection unit 130 can be used to pull down the control voltage VCP to the ground voltage to turn off the power switch 110.

In summary, the switch control circuits, the universal serial bus control circuits and the methods for controlling a power switch provided by the present disclosure can turn off the power switch in a stepwise manner when a short-circuit event is about to happen, thereby preventing the circuit component damage caused by the voltages at the terminals being excessively high or excessively low when the power switch is turned off too quickly, and achieving the effect of short-circuit protection.

What is claimed is:

1. A switch control circuit, comprising:
   a first voltage terminal, configured to receive a first voltage;
   a second voltage terminal, configured to receive a second voltage, wherein the second voltage in a first mode is greater than the second voltage in a second mode;
   a power switch, having a first terminal coupled to the first voltage terminal, a second terminal coupled to the second voltage terminal, and a control terminal configured to receive a control voltage, wherein the power switch comprises at least one transistor, wherein in the first mode, the control voltage is greater than the first voltage so that the at least one transistor in the power switch is fully turned on;
   a first protection unit, coupled between the control terminal of the power switch and the second voltage terminal, and configured to compare a voltage of the second voltage terminal and a first reference voltage, and in the second mode, when the voltage of the second voltage terminal is smaller than the first reference voltage, pull down the control voltage to reduce a current conducted by the at least one transistor in the power switch; and
   a second protection unit, coupled between the control terminal of the power switch and the second voltage terminal, and configured to compare the voltage of the second voltage terminal and a second reference voltage, and in the second mode, when the voltage of the second voltage terminal is smaller than the second reference voltage, turn on a discharge path to pull down the control voltage to a ground voltage, thereby turning of the at least one transistor in the power switch;
   wherein the first reference voltage is greater than the second reference voltage.

2. The switch control circuit of claim 1, wherein the power switch comprises a first transistor, having a first terminal coupled to the first terminal of the power switch, a second terminal coupled to the second terminal of the power switch, and a control terminal coupled to the control terminal of the power switch.

3. The switch control circuit of claim 1, wherein the power switch comprises:
   a first transistor, having a first terminal coupled to the first terminal of the power switch, a second terminal, and a control terminal coupled to the control terminal of the power switch; and
   a second transistor, having a first terminal coupled to the second terminal of the first transistor, a second terminal coupled to the second terminal of the power switch, and a control terminal coupled to the control terminal of the power switch.

4. The switch control circuit of claim 3, wherein:
   the second terminal of the first transistor is a source terminal of the first transistor, and the first terminal of the second transistor is a source terminal of the second transistor; or
   the second terminal of the first transistor is a drain terminal of the first transistor, and the first terminal of the second transistor is a drain terminal of the second transistor.

5. The switch control circuit of claim 3, wherein the first transistor and the second transistor are N-type transistors.

6. The switch control circuit of claim 3, wherein the first transistor is a low-voltage transistor, and the second transistor is a high-voltage transistor.

7. The switch control circuit of claim 1, wherein the first protection unit comprises:
   a first comparator, having a first input terminal coupled to the first reference voltage, a second input terminal coupled to the second voltage terminal, and an output terminal;
   a third transistor, having a first terminal coupled to the ground voltage, a second terminal, and a control terminal coupled to the output terminal of the first comparator;
   a fourth transistor, having a first terminal coupled to the second terminal of the third transistor, a second terminal, and a control terminal coupled to the second voltage terminal; and
   a fifth transistor, having a first terminal coupled to the second terminal of the fourth transistor, a second terminal coupled to the control terminal of the power switch, and a control terminal coupled to the first terminal of the power switch.

8. The switch control circuit of claim 7, wherein the third transistor and the fifth transistor are N-type transistors, and the fourth transistor is a P-type transistor.

9. The switch control circuit of claim 8, wherein when the voltage of the second voltage terminal is smaller than the first reference voltage, the output terminal of the first comparator is switched from a low voltage to a high voltage, so as to turn on the third transistor, and the fourth transistor is configured to lower the control voltage to the sum of the voltage of the second voltage terminal and a threshold voltage of the fourth transistor, so as to reduce a current conducted by the at least one transistor in the power switch.

10. The switch control circuit of claim 8, wherein an absolute value of the threshold voltage of the fourth transistor is greater than an absolute value of a threshold voltage of the at least one transistor in the power switch.

11. The switch control circuit of claim 7, wherein a channel width of the at least one transistor in the power switch is greater than a channel width of each of the third transistor, the fourth transistor and the fifth transistor.

12. The switch control circuit of claim 1, wherein the second protection unit comprises:
a second comparator, having a first input terminal coupled to the second reference voltage, a second input terminal coupled to the second voltage terminal, and an output terminal; and
a sixth transistor, having a first terminal coupled to the ground voltage, a second terminal coupled to the control terminal of the power switch, and a control terminal coupled to the output terminal of the second comparator.

13. The switch control circuit of claim 1, further comprising:
a first capacitor, having a first terminal coupled to the first voltage terminal, and a second terminal coupled to the ground voltage.

14. The switch control circuit of claim 1, further comprising:
a second capacitor, having a first terminal coupled to the second voltage terminal, and a second terminal coupled to the ground voltage.

15. The switch control circuit of claim 1, further comprising:
a charge pump, configured to generate the control voltage to the control terminal of the power switch.

16. The switch control circuit of claim 1, wherein the first voltage terminal receives the first voltage through an external inductance circuit, and the second voltage terminal receives the second voltage through an external inductance circuit.

17. A universal serial bus control circuit, comprising:
a universal serial bus (USB) interface; and
a switch control circuit of claim 1, wherein the first voltage terminal is coupled to a first pin of the USB interface to receive the first voltage, and the second voltage terminal is coupled to a second pin of the USB interface to receive the second voltage.

18. The universal serial bus control circuit of claim 17, wherein:
the USB interface is a type-C USB interface; and
the first pin is a VCONN pin, and the second pin is a configuration channel (CC) pin.

19. A method for controlling a power switch, wherein the power switch has a first terminal configured to receive a first voltage, and a second terminal configured to receive a second voltage, wherein the power switch comprises at least one transistor, and the first voltage is greater than the second voltage, the method comprises:
in a first mode, generating a control voltage to a control terminal of the at least one transistor to turn on the at least one transistor, wherein the control voltage is greater than the first voltage;
in a second mode, pulling down the second voltage to a ground voltage;
during pulling down the second voltage to the ground voltage:
when the voltage of the second terminal of the power switch is smaller than a first reference voltage, lowering the control voltage to reduce a current conducted by the at least one transistor in the power switch; and
when the voltage of the second terminal of the power switch is smaller than a second reference voltage, pulling down the control voltage to the ground voltage to turn off the at least one transistor in the power switch;
wherein the first reference voltage is greater than the second reference voltage.

20. The method of claim 19, wherein the first terminal of the power switch is coupled to a VCONN pin of a type-C USB interface to receive the first voltage, and the second voltage terminal is coupled to a configuration channel (CC) pin of the type-CUSB interface.

* * * * *